United States Patent
Kikkawa et al.

(10) Patent No.: US 9,536,967 B2
(45) Date of Patent: Jan. 3, 2017

(54) RECESSED OHMIC CONTACTS IN A III-N DEVICE

(71) Applicant: Transphorm Inc., Goleta, CA (US)

(72) Inventors: Toshihide Kikkawa, Goleta, CA (US); Kenji Kiuchi, Fukusima (JP); Tsutomu Hosoda, Fukusima (JP); Masahito Kanamura, Fukusima (JP); Akitoshi Mochizuki, Fukusima (JP)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/572,670

(22) Filed: Dec. 16, 2014

(65) Prior Publication Data

US 2016/0172455 A1    Jun. 16, 2016

(51) Int. Cl.
*H01L 29/15* (2006.01)
*H01L 31/0256* (2006.01)
*H01L 29/417* (2006.01)
*H01L 21/3065* (2006.01)
*H01L 21/308* (2006.01)
*H01L 21/324* (2006.01)
(Continued)

(52) U.S. Cl.
CPC ... *H01L 29/41766* (2013.01); *H01L 21/28575* (2013.01); *H01L 21/3065* (2013.01); *H01L 21/3085* (2013.01); *H01L 21/3245* (2013.01); *H01L 29/66462* (2013.01); *H01L 29/7786* (2013.01); *H01L 21/28587* (2013.01); *H01L 29/2003* (2013.01)

(58) Field of Classification Search
CPC ............. H01L 29/41766; H01L 29/66462; H01L 29/7786
See application file for complete search history.

(56) References Cited

U.S. PATENT DOCUMENTS 4,300,091 A   11/1981  Schade, Jr.
4,532,439 A   7/1985   Koike
(Continued)

FOREIGN PATENT DOCUMENTS

CN   1596477   3/2005
CN   1748320   3/2006
(Continued)

OTHER PUBLICATIONS

Authorized officer Sang Won Choi, International Search Report and Written Opinion in PCT/US2015/065597, mailed Mar. 30, 2016, 16 pages.
(Continued)

*Primary Examiner* — Jesse Y Miyoshi
(74) *Attorney, Agent, or Firm* — Fish & Richardson P.C.

(57) ABSTRACT

A device includes a III-N layer having an upper side and a lower side, the lower side being opposite the upper side, and at least one conductive contact on the upper side of the III-N layer, the conductive contact extending into the III-N layer. The conductive contact comprises a top side facing away from the lower side of the III-N layer, and a bottom side facing towards the lower side of the III-N layer. The bottom side includes a first end and a second end opposite the first end, a first side rising from the first end to an intermediate point closer to the top side than the first end, and a second side falling from the intermediate point to the second end further from the top side than the intermediate point.

24 Claims, 11 Drawing Sheets

(51) Int. Cl.
*H01L 29/66* (2006.01)
*H01L 29/778* (2006.01)
*H01L 21/285* (2006.01)
*H01L 29/20* (2006.01)

(56) References Cited

U.S. PATENT DOCUMENTS

| | | | |
|---|---|---|---|
| 4,645,562 A | 2/1987 | Liao et al. |
| 4,665,508 A | 5/1987 | Chang |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,633,195 B2 | 10/2003 | Baudelot et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,914,273 B2 | 7/2005 | Ren et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,038,252 B2 | 5/2006 | Saito et al. |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,199,640 B2 | 4/2007 | De Cremoux et al. |
| 7,217,960 B2 | 5/2007 | Ueno et al. |
| 7,230,284 B2 | 6/2007 | Parikh et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,382,001 B2 | 6/2008 | Beach |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Lee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,465,997 B2 | 12/2008 | Kinzer et al. |
| 7,482,788 B2 | 1/2009 | Yang |
| 7,488,992 B2 | 2/2009 | Robinson |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,547,928 B2 * | 6/2009 | Germain ............... H01L 29/452 257/12 |
| 7,548,112 B2 | 6/2009 | Sheppard |
| 7,550,781 B2 | 6/2009 | Kinzer et al. |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,811,872 B2 | 10/2010 | Hoshi et al. |
| 7,812,369 B2 | 10/2010 | Chini et al. |
| 7,834,380 B2 | 11/2010 | Ueda et al. |
| 7,851,825 B2 | 12/2010 | Suh et al. |
| 7,855,401 B2 | 12/2010 | Sheppard et al. |
| 7,859,014 B2 | 12/2010 | Nakayama et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |

(56) References Cited

U.S. PATENT DOCUMENTS

| | | | |
|---|---|---|---|
| 7,935,985 | B2 | 5/2011 | Mishra et al. |
| 7,939,391 | B2 | 5/2011 | Suh et al. |
| 7,948,011 | B2 | 5/2011 | Rajan et al. |
| 7,955,918 | B2 | 6/2011 | Wu et al. |
| 7,955,984 | B2 | 6/2011 | Ohki |
| 7,956,383 | B2 | 6/2011 | Kuroda et al. |
| 7,960,756 | B2 | 6/2011 | Sheppard et al. |
| 7,961,482 | B2 | 6/2011 | Ribarich |
| 7,965,126 | B2 | 6/2011 | Honea et al. |
| 7,973,335 | B2 | 7/2011 | Okamoto et al. |
| 7,982,242 | B2 | 7/2011 | Goto |
| 7,985,986 | B2 | 7/2011 | Heikman et al. |
| 7,985,987 | B2 | 7/2011 | Kaneko |
| 8,039,352 | B2 | 10/2011 | Mishra et al. |
| 8,044,380 | B2 | 10/2011 | Lee |
| 8,049,252 | B2 | 11/2011 | Smith et al. |
| 8,076,698 | B2 | 12/2011 | Ueda et al. |
| 8,076,699 | B2 | 12/2011 | Chen et al. |
| 8,093,606 | B2 | 1/2012 | Sonobe et al. |
| 8,110,425 | B2 | 2/2012 | Yun |
| 8,114,717 | B2 | 2/2012 | Palacios et al. |
| 8,153,515 | B2 | 4/2012 | Saxler |
| 8,174,048 | B2 | 5/2012 | Beach |
| 8,178,900 | B2 | 5/2012 | Kurachi et al. |
| 8,223,458 | B2 | 7/2012 | Mochizuki et al. |
| 8,237,196 | B2 | 8/2012 | Saito |
| 8,237,198 | B2 | 8/2012 | Wu et al. |
| 8,264,003 | B2 | 9/2012 | Herman |
| 8,361,816 | B2 | 1/2013 | Lee et al. |
| 8,363,437 | B2 | 1/2013 | Wang et al. |
| 8,389,975 | B2 | 3/2013 | Kikuchi et al. |
| 8,389,977 | B2 | 3/2013 | Chu et al. |
| 8,390,000 | B2 | 3/2013 | Chu et al. |
| 8,404,042 | B2 | 3/2013 | Mizuhara et al. |
| 8,431,960 | B2 | 4/2013 | Beach et al. |
| 8,455,885 | B2 | 6/2013 | Keller et al. |
| 8,471,267 | B2 | 6/2013 | Hayashi et al. |
| 8,476,125 | B2 | 7/2013 | Khan et al. |
| 8,492,779 | B2 | 7/2013 | Lee |
| 8,502,323 | B2 | 8/2013 | Chen |
| 8,519,438 | B2 | 8/2013 | Mishra et al. |
| 8,525,231 | B2 | 9/2013 | Park et al. |
| 8,530,904 | B2 | 9/2013 | Treu et al. |
| 8,598,937 | B2 | 12/2013 | Lal et al. |
| 8,603,880 | B2 | 12/2013 | Yamada |
| 8,614,460 | B2 | 12/2013 | Matsushita |
| 8,652,948 | B2 | 2/2014 | Horie et al. |
| 8,674,407 | B2 | 3/2014 | Ando et al. |
| 8,698,198 | B2 | 4/2014 | Kuraguchi |
| 8,716,141 | B2 | 5/2014 | Dora et al. |
| 8,742,460 | B2 | 6/2014 | Mishra et al. |
| 8,772,832 | B2 | 7/2014 | Boutros |
| 8,785,305 | B2 | 7/2014 | Ramdani |
| 8,803,246 | B2 | 8/2014 | Wu et al. |
| 2003/0006437 | A1 | 1/2003 | Mizuta et al. |
| 2003/0030056 | A1 | 2/2003 | Callaway, Jr. |
| 2004/0119067 | A1 | 6/2004 | Weeks, Jr. et al. |
| 2005/0087763 | A1* | 4/2005 | Kanda ............... H01L 27/14609 257/192 |
| 2005/0133816 | A1 | 6/2005 | Fan et al. |
| 2005/0189559 | A1 | 9/2005 | Saito et al. |
| 2006/0076677 | A1 | 4/2006 | Daubenspeck et al. |
| 2006/0145189 | A1 | 7/2006 | Beach |
| 2006/0189109 | A1 | 8/2006 | Fitzgerald |
| 2006/0202272 | A1 | 9/2006 | Wu et al. |
| 2006/0226442 | A1 | 10/2006 | Zhang et al. |
| 2007/0018199 | A1 | 1/2007 | Sheppard et al. |
| 2007/0045670 | A1 | 3/2007 | Kuraguchi |
| 2007/0128743 | A1 | 6/2007 | Huang et al. |
| 2007/0131968 | A1 | 6/2007 | Morita et al. |
| 2007/0145417 | A1 | 6/2007 | Brar et al. |
| 2007/0205433 | A1 | 9/2007 | Parikh et al. |
| 2007/0210329 | A1 | 9/2007 | Goto |
| 2007/0228477 | A1 | 10/2007 | Suzuki et al. |
| 2007/0249119 | A1 | 10/2007 | Saito |
| 2007/0295985 | A1 | 12/2007 | Weeks, Jr. et al. |
| 2008/0073670 | A1 | 3/2008 | Yang et al. |
| 2008/0258150 | A1 | 10/2008 | McCarthy et al. |
| 2008/0272397 | A1 | 11/2008 | Koudymov et al. |
| 2008/0308813 | A1 | 12/2008 | Suh et al. |
| 2009/0045438 | A1 | 2/2009 | Inoue et al. |
| 2009/0050936 | A1 | 2/2009 | Oka |
| 2009/0072269 | A1 | 3/2009 | Suh et al. |
| 2009/0075455 | A1 | 3/2009 | Mishra |
| 2009/0085065 | A1 | 4/2009 | Mishra et al. |
| 2009/0140262 | A1 | 6/2009 | Ohki et al. |
| 2010/0044752 | A1 | 2/2010 | Marui |
| 2010/0065923 | A1 | 3/2010 | Charles et al. |
| 2010/0133506 | A1 | 6/2010 | Nakanishi et al. |
| 2010/0203234 | A1 | 8/2010 | Anderson et al. |
| 2010/0219445 | A1 | 9/2010 | Yokoyama et al. |
| 2011/0012110 | A1 | 1/2011 | Sazawa et al. |
| 2012/0217512 | A1 | 8/2012 | Renaud |
| 2012/0223317 | A1* | 9/2012 | Bahl ............... H01L 29/4175 257/76 |
| 2012/0267637 | A1 | 10/2012 | Jeon et al. |
| 2013/0056744 | A1 | 3/2013 | Mishra et al. |
| 2013/0126943 | A1 | 5/2013 | Tanaka et al. |
| 2013/0328061 | A1 | 12/2013 | Chu et al. |
| 2013/0334538 | A1 | 12/2013 | Saunier |
| 2014/0084346 | A1 | 3/2014 | Tajiri |
| 2014/0099757 | A1 | 4/2014 | Parikh et al. |
| 2014/0264370 | A1 | 9/2014 | Keller et al. |
| 2014/0264455 | A1 | 9/2014 | Keller et al. |

FOREIGN PATENT DOCUMENTS

| | | |
|---|---|---|
| CN | 101107713 | 1/2008 |
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 09-306926 | 11/1997 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-253620 | 9/2004 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-505501 | 3/2007 |
| JP | 2007-215331 | 8/2007 |
| JP | 2007-227409 | 9/2007 |
| JP | 2008-091699 | 4/2008 |
| JP | 2008-199771 | 8/2008 |
| JP | 2008-243848 | 10/2008 |
| JP | 2009-503815 | 1/2009 |
| JP | 2009-524242 | 6/2009 |
| JP | 2010-087076 | 4/2010 |
| JP | 2010-525023 | 7/2010 |
| JP | 2010-539712 | 12/2010 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |

(56) References Cited

FOREIGN PATENT DOCUMENTS

| | | |
|---|---|---|
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Chung Keun Lee, International Search Report and Written Opinion in PCT/US2008/076030, mailed Mar. 23, 2009, 10 pages.
Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25, 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
Authorized officer Agnès Wittmann-Regis, International Preliminary Report on Patentability in PCT/US2013/035837, mailed Oct. 23, 2014, 6 pages.
Authorized officer Sang Won Choi, International Search Report and Written Opinion in PCT/US2013/048275, mailed Oct. 14, 2013, 17 pages.
Authorized officer Simin Baharlou, International Preliminary Report on Patentability in PCT/US2013/048275, mailed Jan. 8, 2015, 14 pages.
Authorized officer Hye Lyun Park, International Search Report and Written Opinion in PCT/US2013/050914, mailed Oct. 18, 2013, 11 pages.
Authorized officer Yukari Nakamura, International Preliminary Report on Patentability in PCT/US2013/050914, mailed Jan. 29, 2015, 8 pages.
Authorized officer Sang Won Choi, International Search Report and Written Opinion in PCT/US2013/024470, mailed May 27, 2013, 12 pages.
Authorized officer Simin Baharlou, International Preliminary Report on Patentability in PCT/US2013/024470, mailed Aug. 14, 2014, 9 pages.
Authorized officer June Young Son, International Search Report and Written Opinion in PCT/US2014/016298, mailed May 23, 2014, 15 pages.
Authorized officer Kihwan Moon, International Preliminary Report on Patentability in PCT/US2014/016298, mailed Aug. 27, 2015, 12 pages.

(56) References Cited

OTHER PUBLICATIONS

Authorized officer Tae Hoon Kim, International Search Report and Written Opinion in PCT/US2014/027523, mailed Jul. 30, 2014, 14 pages.
Authorized officer Nora Lindner, International Preliminary Report on Patentability in PCT/US2014/027523, mailed Sep. 24, 2015, 11 pages.
Authorized officer June Young Son, International Search Report and Written Opinion in PCT/US2014/024191, mailed Aug. 7, 2014, 11 pages.
Authorized officer Kihwan Moon, International Preliminary Report on Patentability in PCT/US2014/024191, mailed Sep. 24, 2015, 8 pages.
Authorized officer June Young Son, International Search Report and Written Opinion in PCT/US2014/046030, mailed Oct. 21, 2014, 12 pages.
Authorized officer Agnès Wittmann-Regis, International Preliminary Report on Patentability in PCT/US2014/046030, mailed Jan. 28, 2016, 9 pages.
European Search Report in Application No. 10 81 5813.0, mailed Mar. 12, 2013, 9 pages.
Search Report and Action in TW Application No. 098132132, issued Dec. 6, 2012, 8 pages.
Search Report and Action in TW Application No. 098141930, issued Jul. 10, 2014, 7 pages.
Chinese First Office Action for Application No. 200880120050.6, Aug. 2, 2011, 10 pages.
Chinese First Office Action for Application No. 200980114639.X, May 14, 2012, 13 pages.
Ando et al., "10-W/mm AlGaN—GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.

Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H—SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN—GaN Junctions with Ultrathin AlN Interlayers: Expanding Heterojunction Design," Applied Physics Letters, 2002, 80(23):4387-4389.
Khan et al, "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage," Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(111): Stress Control and Application to Filed-effect Transistors," Journal of Applied Physics, 2001, 89(12):7846-7851.
Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Oka and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
Tracy Frost, "Planar, Low Switching Loss, Gallium Nitride Devices for Power Conversion Applications," SBIR N121-090 (Navy), 2012, 3 pages.

(56) References Cited

OTHER PUBLICATIONS

Rajan et al., "Advanced Transistor Structures Based on N-face GaN," 32M International Symposium on Compound Semiconductors (ISCS), Sep. 18-22, 2005, Europa-Park Rust, Germany, 2 pages.

Reiher et al., "Efficient Stress Relief in GaN Heteroepitaxy on Si(111) Using Low-temperature AlN Interlayers," Journal of Crystal Growth, 2003, 248:563-567.

Saito et al., "Recessed-gate Structure Approach Toward Normally Off High-voltage AlGaN/GaN HEMT for Power Electronics Applications," IEEE Transactions on Electron Device, 2006, 53(2):356-362.

Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.

Shen, "Advanced Polarization-based Design of AlGaN/GaN HEMTs," Jun. 2004, PhD Thesis, University of California, Santa Barbara, 192 pages.

Sugiura et al., "Enhancement-mode n-channel GaN MOSFETs Fabricated on p—GaN Using $HfO_2$ as Gate Oxide," Electronics Letters, 2007, vol. 43, No. 17, 2 pages.

Suh et al. "High-Breakdown Enhancement-mode AlGaN/GaN HEMTs with Integrated Slant Field-Plate," Electron Devices Meeting, 2006, IEDM '06 International, 3 pages.

Tipirneni et al. "Silicon Dioxide-encapsulated High-Voltage AlGaN/GaN HFETs for Power-Switching Applications," IEEE Electron Devices Letters, 2007, 28(9):784-786.

Vetury et al., "Direct Measurement of Gate Depletion in High Breakdown (405V) Al/GaN/GaN Heterostructure Field Effect Transistors," IEDM 98, 1998, pp. 55-58.

Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.

Wang et al., "Enhancement-mode $Si_3N_4$/AlGaN/GaN MISHFETs," IEEE Electron Device Letters, 2006, 27(10):793-795.

Wu, "AlGaN/GaN Microwave Power High-Mobility Transistors," PhD Thesis, University of California, Santa Barbara, Jul. 1997, 134 pages.

Wu et al., "A 97.8% Efficient GaN HEMT Boost Converter with 300-W Output Power at 1 MHz," Electronic Device Letters, 2008, IEEE, 29(8):824-826.

Yoshida, "AlGan/GaN Power FET," Furukawa Review, 2002, 21:7-11.

Zhang, "High Voltage GaN HEMTs with Low On-resistance for Switching Applications," PhD Thesis, University of California, Santa Barbara, Sep. 2002, 166 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

\* cited by examiner

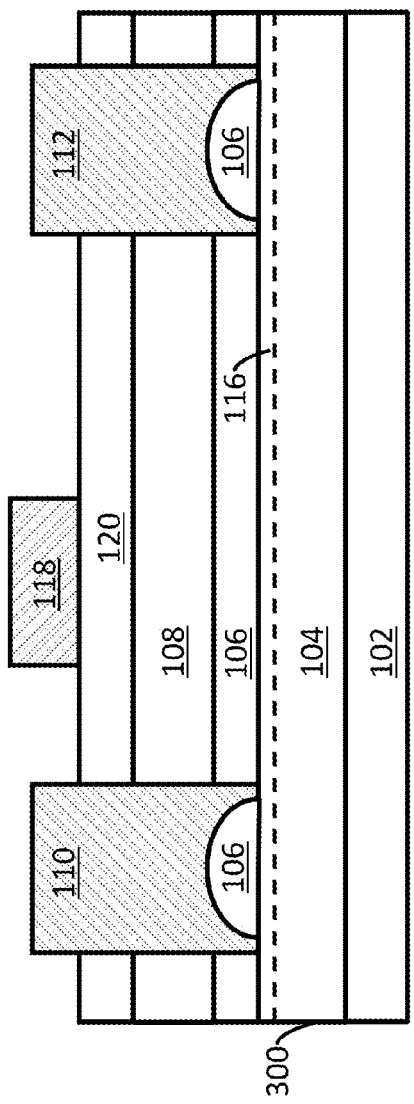
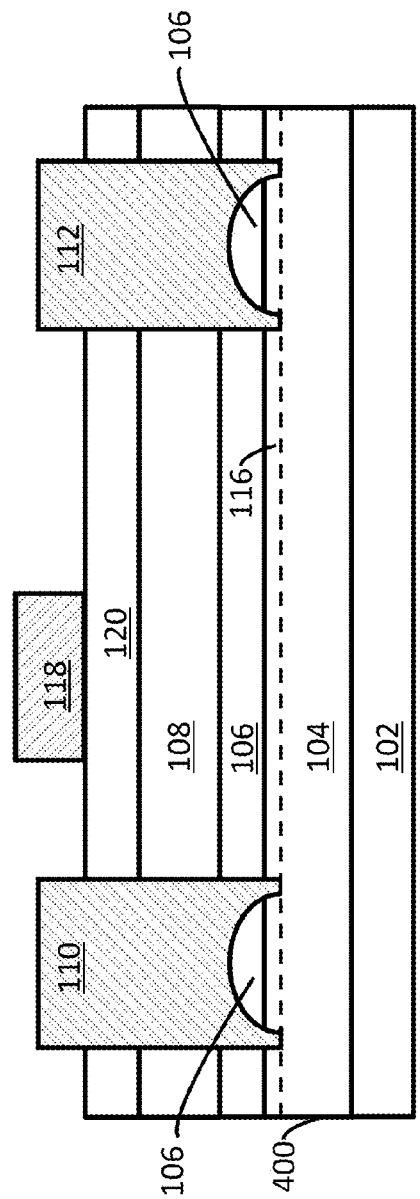
Figure 3
Figure 4

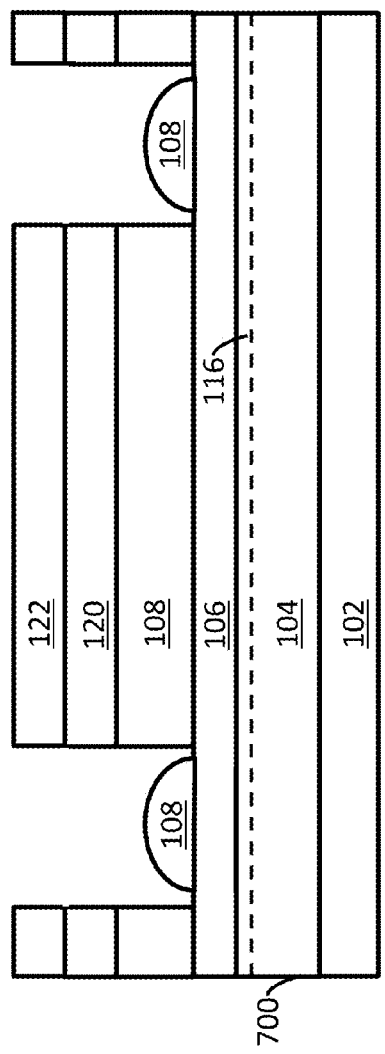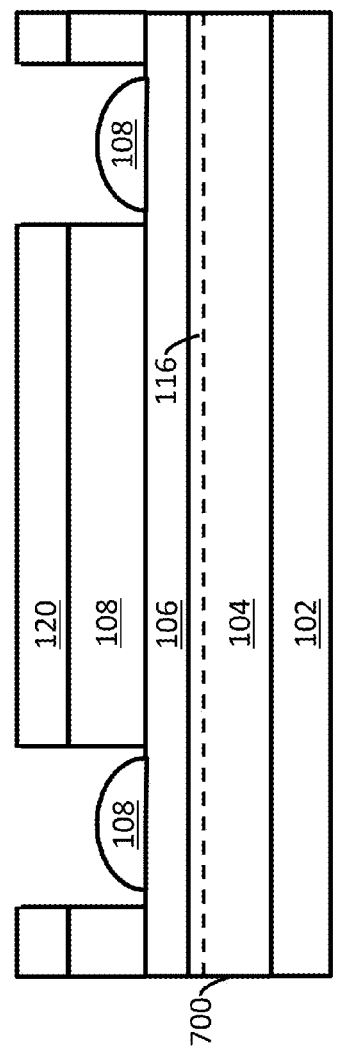
Figure 7C
Figure 7D

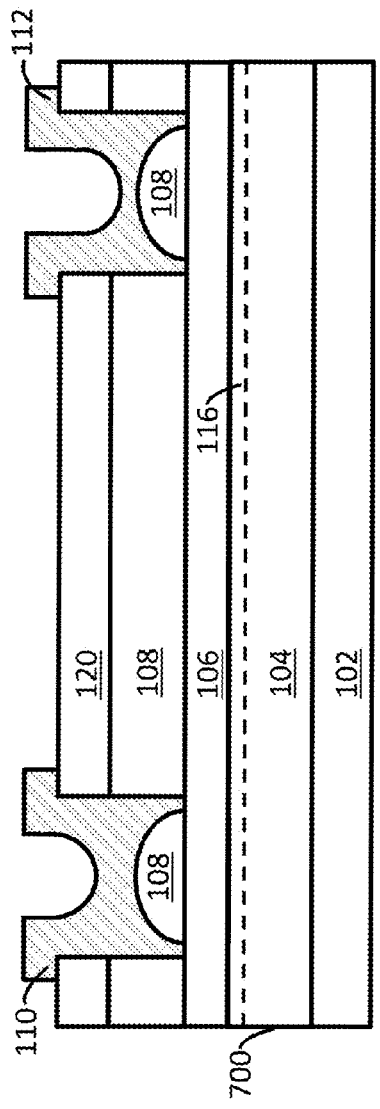
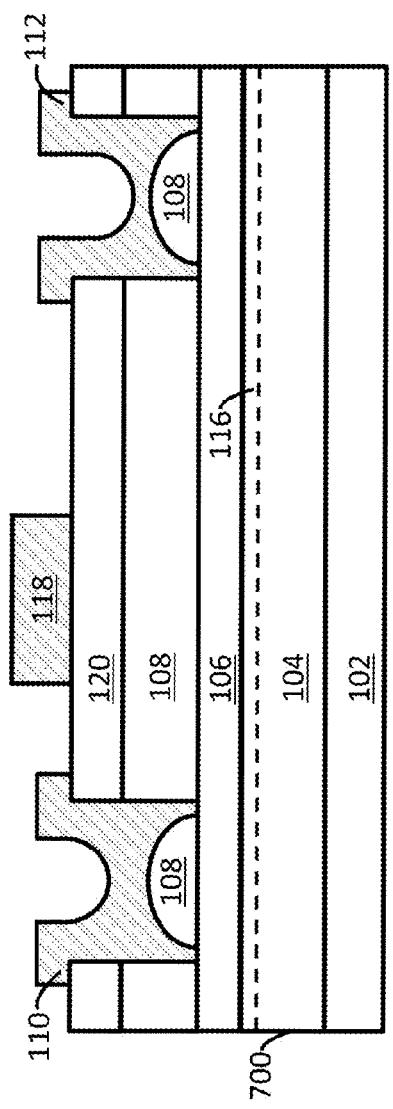
Figure 7E
Figure 7F

RECESSED OHMIC CONTACTS IN A III-N DEVICE

TECHNICAL FIELD

This specification relates to semiconductor devices, in particular nitride-based devices such as transistors and diodes, which include one or more ohmic contacts.

BACKGROUND

Transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they can suffer from a number of disadvantages, including relatively low switching speeds and high levels of electrical noise. More recently, silicon carbide (SiC) power devices have been considered due to their superior properties. III-Nitride or III-N semiconductor devices, such as gallium nitride (GaN) devices, are now emerging as attractive candidates to carry large currents, support high voltages, and to provide very low on-resistance and fast switching times.

Forming ohmic contacts to III-N material structures, which are utilized in many devices, is often achieved by depositing one or more metal layers on the III-N material and then annealing the structure, causing the metals and underlying III-N material to intermix and form an alloy. While such an alloying process for forming ohmic contacts has been shown to successfully result in low-resistivity ohmic contacts, the reliability and yield of this process has typically been lower than required for commercial scale production.

SUMMARY

In a first aspect, a device includes a III-N layer having an upper side and a lower side, the lower side being opposite the upper side, and at least one conductive contact on the upper side of the III-N layer, the conductive contact extending into the III—N layer. The conductive contact comprises a top side facing away from the lower side of the III-N layer, and a bottom side facing towards the lower side of the III-N layer. The bottom side includes a first end and a second end opposite the first end, a first side rising from the first end to an intermediate point closer to the top side than the first end, and a second side falling from the intermediate point to the second end, the second end being further from the top side than the intermediate point.

In a second aspect, a method for fabricating a device includes forming a III-N layer having an upper side and a lower side, the lower side being opposite the upper side. The method further includes forming a recess in a surface on the upper side of the III-N layer, the forming of the recess including etching the surface of the III-N layer using a resist pattern, and forming a conductive contact over the recess in the surface of the III-N layer. The conductive contact includes a top side facing away from the lower side of the III-N layer, and a bottom side facing towards the lower side of the III-N layer. The bottom side comprises a first end and a second end opposite the first end, a first side rising from the first end to an intermediate point closer to the top side than the first end, and a second side falling from the intermediate point to the second end, the second end being further from the top side than the intermediate point.

In a third aspect, a method for fabricating a device includes forming a recess in a surface of a III-N layer having a conductive channel therein, where forming the recess includes etching the surface of the III-N layer using a resist pattern, and forming a conductive contact over the recess in the surface of the III-N layer, the conductive contact being in electrical contact with the conductive channel, the conductive contact having a bottom side in contact with a bottom surface of the recess and a top side opposite the bottom. The etching of the surface causes the bottom surface of the recess to have a first end and a second end opposite the first end, a first side rising monotonically from the first end to an intermediate point closer to the top side of the conductive contact than the first end, and a second side falling monotonically from the intermediate point to the second end, the second end being further from the top side of the conductive contact than the intermediate point.

In a fourth aspect, a device includes a III-N layer having an upper side and a lower side, the lower side being opposite the upper side, and a conductive contact on the upper side of the III-N layer. The conductive contact includes a top side facing away from the lower side of the III-N layer and a bottom side facing towards the lower side of the III-N layer, the bottom side including a first end, a second end opposite the first end, and an intermediate point between the first end and the second end. The device further includes a 2DEG channel in the III-N layer, wherein the 2DEG channel includes a first portion below the intermediate point and second portions below the first and second ends, the second portions having a higher electron concentration than the first portion.

Devices and methods described herein may include one or more of the following features. The first side may rise monotonically from the first end to the intermediate point and the second side may fall monotonically from the intermediate point to the second end. The III-N layer may include a III-N channel layer and a III-N barrier layer, wherein a compositional difference between the III-N channel layer and the III-N barrier layer causes a 2DEG channel to be induced in the III-N channel layer adjacent to the III-N barrier layer. The first side can curve from the first end to the intermediate point and the second side can curve from the second end to the intermediate point, forming a substantially rounded trench shape in the bottom side of the conductive contact. The III-N layer may include a GaN layer, a III-N spacer layer on the GaN layer, and a III-N barrier layer on the III-N spacer layer. Additionally, the III-N spacer layer may have a larger bandgap than the III-N barrier layer. In the device, at least one of the first end and the second end may extend through the III-N spacer layer to contact the GaN layer. The III-N spacer layer can include AlN and the III-N barrier layer can include AlGaN.

The conductive contact may be a source contact, the device further including a drain contact and a gate contact, forming a transistor. The drain contact can include a drain top side facing away from the lower side of the III-N layer, and a drain bottom side facing towards the lower side of the III-N layer, wherein the bottom layer comprises a drain first end and a drain second end opposite the drain first end, a drain first side rising from the drain first end to a drain intermediate point closer to the top side than the drain first end, and a drain second side falling from the drain intermediate point to a drain second end further from the top side than the drain intermediate point. The transistor can be a lateral transistor having the drain, source, and gate on a same side. The drain first side may rise monotonically from the drain first end to the drain intermediate point and the drain second side may fall monotonically from the drain intermediate point to the drain second end. The conductive contact can have a normalized contact resistance of 0.3 Ohm-mm or less. In the device, the first end and/or the second end may have a width less than 300 nanometers. The III-N layer may be on a substrate.

Forming the conductive contact can include forming the conductive contact so that the first side rises monotonically from the first end to the intermediate point and the second side falls monotonically from the intermediate point to the second end. The method of forming the device may include heating the device to a temperature between 300° C. and 600° C. Heating the device may also include heating the device for one to three minutes. Etching the surface of the III-N layer can include performing a dry etch using a chlorine based gas. Furthermore, etching the surface of the III-N layer can include performing a plasma etch in $Cl_2$ plasma at an RF bias of 25 W or less. Forming the III-N layer may comprise forming a GaN layer, an AlN spacer layer on the GaN layer, and an AlGaN layer on the AlN spacer layer. Additionally, forming the recess can include forming the recess through the AlGaN layer up to the AlN spacer layer. Forming the recess may include forming the recess through the AlGaN layer and into the AlN spacer layer. Forming the recess can include forming the recess through the AlGaN layer and the AlN spacer layer and into the GaN layer.

The III-N layer may include a recess, and the conductive contact is in the recess. A separation between the 2DEG channel and the first end of the bottom side of the conductive contact may be less than a separation between the 2DEG channel and the intermediate point. The conductive contact can be in ohmic contact with the 2DEG channel.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

FIGS. 3-5 are cross-sectional views of example devices where the source and drain contacts 110 and 112 are recessed to different depths.

FIGS. 7A-7F are cross-sectional views of an example semiconductor device during fabrication of the device.

Like reference symbols in the various drawings indicate like elements.

DETAILED DESCRIPTION

Figure 1A:
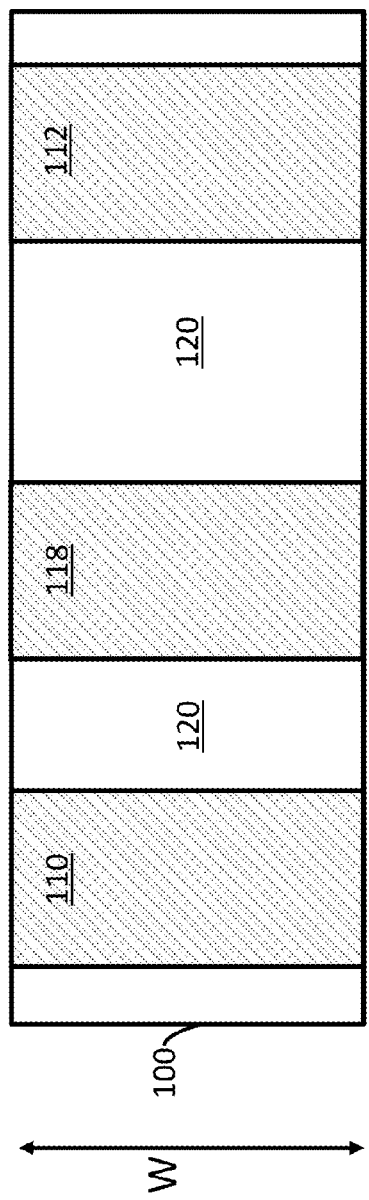
FIG. 1A is a plan view (top view) of an example III-Nitride (III-N) transistor.
Figure 1B:
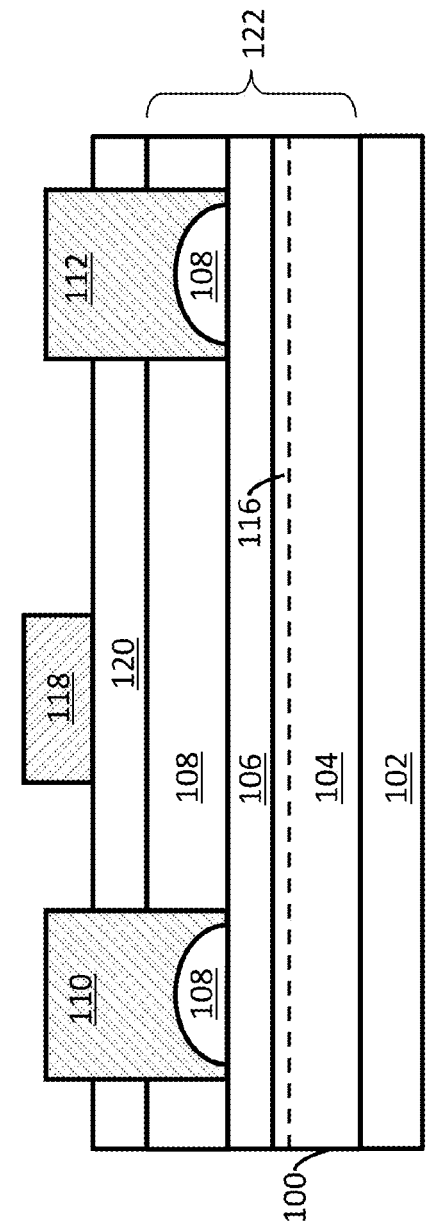
FIG. 1B is a cross-sectional view of the transistor.

FIG. 1A is a plan view (top view) of an example III-Nitride (III-N) transistor 100. FIG. 1B is a cross-sectional view of the transistor 100. As illustrated in FIG. 1A, the transistor includes a substrate 102 (which may optionally be omitted) and a III-N layer 122.

The substrate can be silicon, SiC, AlN, GaN, sapphire, or any other suitable growth substrate for the growth of III-N materials. The III-N layer 122 includes a III-N channel layer 104 and a III-N spacer layer 106, and a III-N barrier layer 108, where the compositions of layers 104, 106, and 108 are selected to induce the 2DEG 116 in the III-N channel layer 104 near the interface between the III-N channel layer 104 and the III-N spacer layer 106. In some implementations, the spacer layer 106 may be omitted. In this case, the III-N barrier layer 108 is formed directly on the III-N channel layer 104, and the compositions of layers 104 and 108 are selected to induce the 2DEG 116 in the III-N channel layer 104 near the interface between the III-N channel layer 104 and the III-N barrier layer 108.

A gate contact 118 is deposited on the III-N layer 122. In some implementations, the gate contact 118 directly contacts the underlying III-N layer 122 (not shown). In other implementations, as illustrated in FIG. 1B, an insulator layer 120 is included between the gate 118 and the underlying III-N layer 122. Source and drain ohmic contacts 110 and 112 are deposited on opposite sides of the gate 118 on the III-N layer 122. The source and drain contacts 110 and 112 form ohmic (or substantially ohmic) contacts to the device channel 116. The transistor 100 can be a lateral transistor having the gate 118, drain 110, and source 112 on a same side. A voltage applied to the gate 118, relative to the source contact 112, modulates the 2DEG charge density in the gate region of the device (i.e., the region directly under the gate).

As used in this document, the terms III-Nitride or III-N materials, layers, devices, and structures refer to a material, device, or structure comprised of a compound semiconductor material according to the stoichiometric formula $B_wAl_xIn_yGa_zN$, where w+x+y+z is about 1, and w, x, y, and z are each greater than or equal to zero and less than or equal to 1. In a III-Nitride or III-N device, the conductive channel can be partially or entirely contained within a III-N material layer.

The ohmic metals, of which source and drain contacts 110 and 112 are formed, typically include at least one metal with a relatively low metal work function, for example aluminum (Al) or titanium (Ti). In some implementations, the ohmic contacts 110 and 112 include titanium, aluminum, nickel, or gold, or combinations thereof. In some implementations, the III-N layer 122 includes a GaN layer 104 on the substrate 102, an AlN spacer layer 106 on the GaN layer 104, and an AlGaN layer 108 on the AlN spacer layer 106. The AlN spacer layer 106 can be useful, e.g., to increase mobility and lower an on-state resistance of the transistor 100. The AlN spacer layer 106 may be formed of AlN, or alternatively may be formed of another material having a larger bandgap than the AlGaN layer 108. For example, layer 106 may be formed of AlInGaN, where the compositions of Al, In, and Ga are selected such that layer 106 has a larger bandgap than layer 108. Or, layer 106 may be formed of AlGaN, where the fractional composition of Al in layer 106 is larger than that in layer 108.

The transistor 100 can include an insulator layer 120 between the gate 118 and the AlGaN layer 108. The insulator layer 120 can also serve as a passivation layer, preventing or suppressing dispersion by preventing or suppressing voltage fluctuations at the uppermost III-N surface on either sides of the gate 118. The insulator layer 120 can be made of $Si_xN_y$, $Al_2O_3$, Sift, $Al_xSi_yN$, or the like, and can be prepared by metal organic chemical vapor deposition (MOCVD), low pressure chemical vapor deposition (LPCVD), plasma enhanced chemical vapor deposition (PECVD), chemical vapor deposition (CVD), sputtering, atomic layer deposition (ALD), high density chemical vapor deposition, or any suitable deposition process. In a particular example, the insulator layer 120 is a Silicon Nitride ($Si_xN_y$) layer formed by MOCVD.

The source and drain contacts 110 and 112 exhibit a normalized contact resistance that can be measured, in Ohm-mm, with respect the width W of the transistor 100. The total resistance of each contact, measured in Ohms, is then equal to the normalized contact resistance (measured in Ohm-mm) multiplied by the width W (measured in millimeters) of the transistor. It can be useful, e.g., to improve device performance, to have ohmic contacts with low normalized resistances. In some conventional transistors, the ohmic contacts exhibit normalized resistances in the range of 0.8-2.0 Ohm-mm. The example transistor 100 of FIGS. 1A-B can have ohmic contacts that exhibit normalized resistances in the range of 0.2-0.3 Ohm-mm, e.g., by virtue of the shape and the depth of the ohmic contacts.

Figure 2:
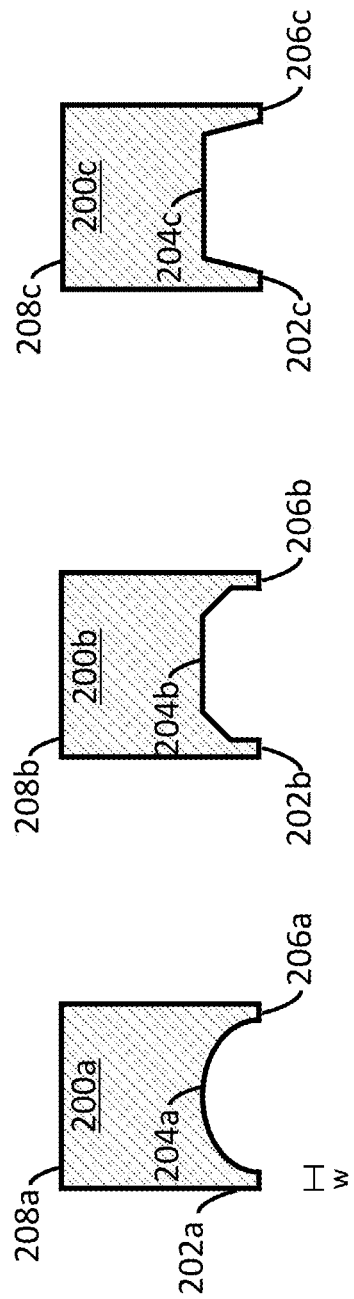
FIG. 2 is cross-sectional view of three example contacts.

FIG. 2 is cross-sectional view of three example contacts 200a-c that can be used, e.g., for any one or more of the source and/or drain contacts 110 and 112 of the example transistor 100 of FIGS. 1A-B. Each of the example contacts 200a-c includes a top side 208a-c facing away from the substrate 102 and a bottom side facing in the opposite direction.

The bottom side of each contact 200a-c includes a first end 202a-c and a second end 206a-c opposite the first end 202a-c. Each contact 200a-c includes a first side that rises, e.g., monotonically, from the first end 202a-c to an intermediate point 204a-c closer to the top side 208a-c than the first end 202a-c and a second side that falls, e.g., monotonically, from the intermediate point 204a-c to the second end 206a-c. The second end 206a-c is further from the top side 208a than the intermediate point 204a-c.

The first ends 202a and/or the second ends 206a of the contacts 200a-c can have a width ("w") where the end is flat or substantially flat. The width can be, e.g., between 20 and 300 nanometers, for example between 50 and 200 nanometers.

The first example contact 200a has a first side that curves from the first end 202a to the intermediate point 204a and a second side that curves from the intermediate point 204a to the second end 206a, forming a substantially rounded trench shape in the bottom side of the contact 200a. The second example contact 200b has a first side that rises in three line segments from the first end 202b to the intermediate point 204b and a second side that falls in three line segments from the intermediate point 204b to the second end 206b. The third example contact 200c has a first side that rises in three line segments from the first end 202c to the intermediate point 204c and a second side that falls in three line segments from the intermediate point 204c to the second end 206c.

Figure 5:
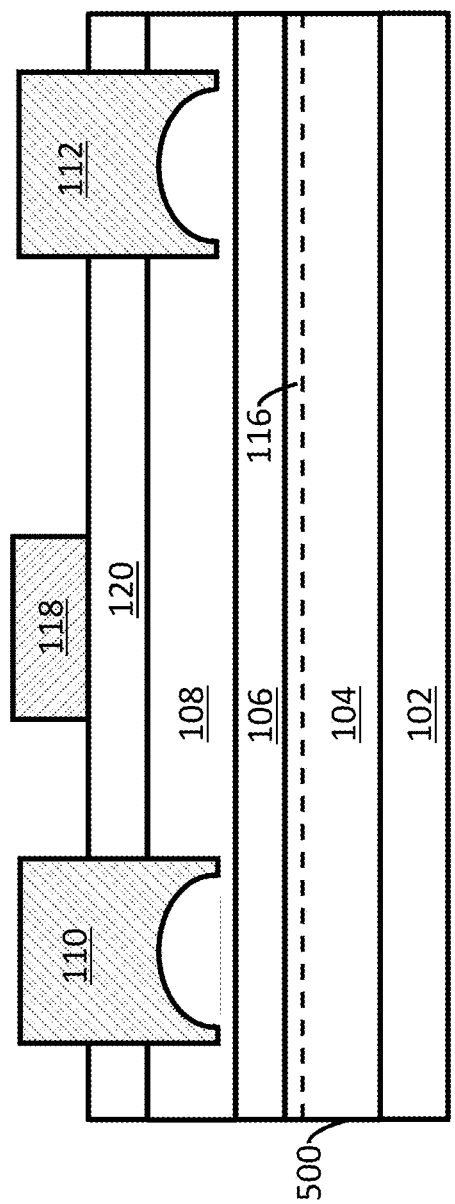

FIGS. 3-5 are cross-sectional views of example devices 300, 400, and 500 where the source and drain contacts 110 and 112 are recessed to different depths than they are in the example device 100 of FIG. 1.

FIG. 3 shows an example device 300 where the source and drain contacts 110 and 112 are recessed through the spacer layer 106 to a top of a III-N channel layer 104 (e.g., so that the first and/or second end of the bottom side of the contact reach the top of the III-N channel layer 104). FIG. 4 shows an example device 400 where the source and drain contacts 110 and 112 are recessed through the channel 116 of the III-N channel layer 104. FIG. 5 shows an example device 500 where the source and drain contacts 110 and 112 are recessed into the III-N barrier layer 108 but do not reach the spacer layer 106.

The recess depth can affect the resistance of the contacts 110 and 112. In some implementations, increasing the recess depth can decrease the resistance up to a point where further increasing the recess depth does not decrease the resistance. Beyond a certain depth, the resistance may increase as the recess depth is increased.

Figure 6:
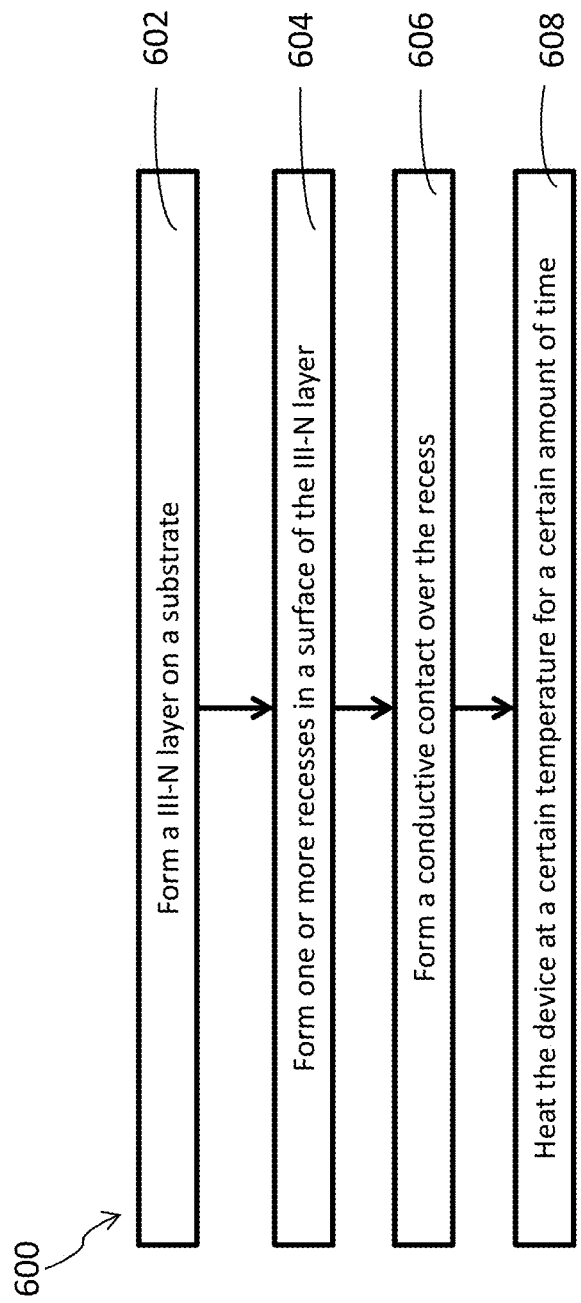
FIG. 6 is a flow diagram of an example process for fabricating a semiconductor device.

FIG. 6 is a flow diagram of an example process 600 for fabricating a semiconductor device. The process 600 can be used, e.g., to fabricate the devices 100, 300, 400, and 500 of FIGS. 1A-B and 3-5.

A III-N layer is formed on a substrate (602). The substrate can be a silicon wafer. The III-N layer can include a GaN layer on the substrate; an AlN spacer layer on the GaN layer; and an AlGaN layer on the AlN spacer layer. The III-N layer can be formed by either directly growing the III-N layer on the substrate, or alternatively by growing the III-N layer or parts of the III-N layer on a first substrate, detaching the buffer layer from the first substrate, and bonding the buffer layer to the substrate. Forming the III-N layer can include using any appropriate deposition process.

One or more recesses are formed in a surface of the III-N layer (604). For example, the surface of the III-N layer can be etched using a patterned resist. Etching the surface can include performing a dry etch using a chlorine based gas. In some implementations, dry etching techniques, e.g., plasma etching, digital plasma etching, or reactive ion etching (RIE), are used to form the recesses.

The parameters of the etching can be adjusted to control the shape and depth of the recesses. For example, the ion energy used during the etch, the pressure applied during the etch, and the resist pattern used can be varied to achieve a target depth and shape. As an example, the following process may achieve a recess having the profile of the recesses in FIG. 1B in which source and drain contacts 110 and 112, respectively, are deposited. After formation of III-N layer structure 122 and insulator layer 120, a single layer photoresist layer having a thickness of between 1.1 and 1.2 microns is deposited over the surface and patterned to expose the underlying material in the regions is which the recess is formed. The photoresist acts as an etch mask, preventing material beneath it from being etched during a subsequent etch process. The recess is then etched in an ECR plasma etcher using $Cl_2$ as an etchant gas. 50 sccm of $Cl_2$ is injected into the chamber, the RF bias power is maintained at 20 W, and the chamber pressure is maintained at 2.5 mTorr. Following the etch, the device is removed from the etch chamber, and the photoresist mask is removed.

Conductive contacts are formed over the one or more recesses (606). Due to the shape of the recesses, the conductive contacts have a bottom side including a first side rising, e.g., rising monotonically, from a first end to an intermediate point and a second side falling, e.g., falling monotonically, from the intermediate point to a second end opposite the first end.

The device is heated at a certain temperature for a certain amount of time (608). For example, the device can be heated to a temperature between 300° C. and 600° C. The device can be heated for one to three minutes. Typically, the heat application is performed at a temperature that is not sufficiently high to cause the contacts to alloy with the III-N layers.

FIGS. 7A-7F are cross-sectional views of an example semiconductor device 700 during fabrication of the device 700. The device 700 can be fabricated, e.g., using the process 600 illustrated in FIG. 6.

Figure 7A:
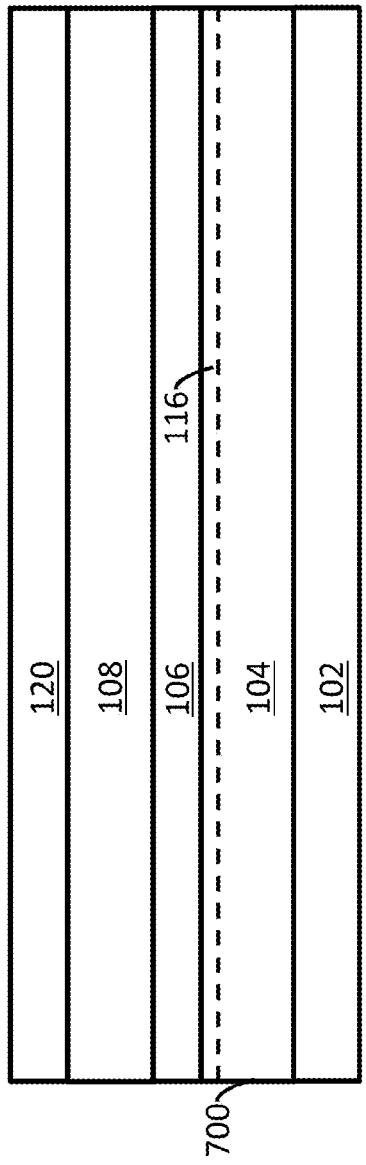
Figure 7B:
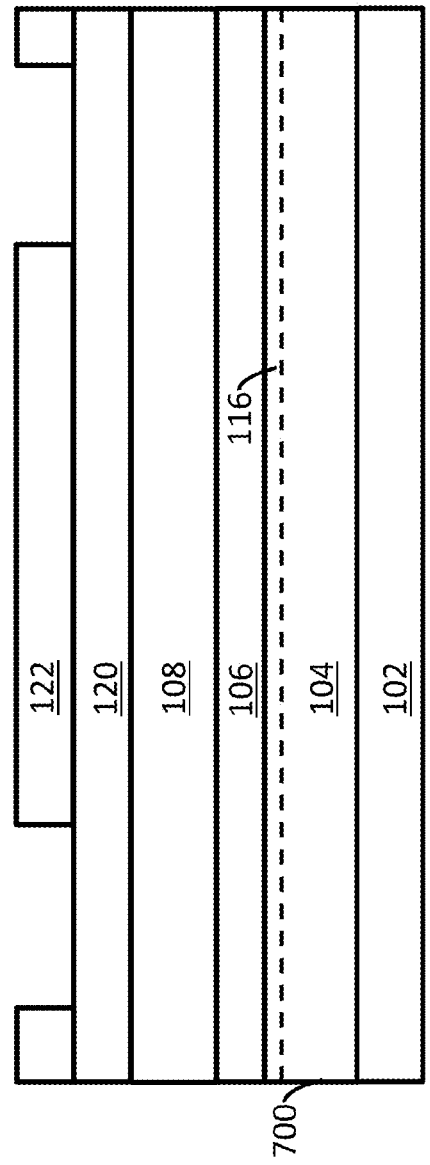

FIG. 7A shows the device 700 after III-N layers 104, 106, and 108 have been formed on a substrate 102, and insulator layer 120 has been formed on III-N layer 108. FIG. 7B shows the device 700 after a patterned photoresist 122 (or alternatively another masking layer) has been placed on the device 700 so that the device 700 can be etched. As shown, the photoresist layer 122 includes one or more apertures, so that some the III-N materials below the one or more apertures may be subsequently etched. FIG. 7C shows the device 700 after the device 700 has been etched to leave recesses in one or more of the III-N layers (e.g., layer 108) below the apertures in the photoresist layer. For example, the recesses can be etched to the top of the spacer layer 106, as shown. As also seen in FIG. 7C, the etch is performed under conditions that cause III-N material below the outer portions of the aperture to etch at a higher rate than III-N material below the inner portion of the aperture, thereby resulting in the desired profile for the recess.

FIG. 7D shows the device 700 after the patterned resist 122 has been removed from the device 700. FIG. 7E shows the device 700 after source and drain contacts 110 and 112 have been formed over the recesses. FIG. 7F shows the device 700 after a gate 118 has been formed between the source and drain contacts 110 and 112, thereby forming a transistor.

Figure 8:
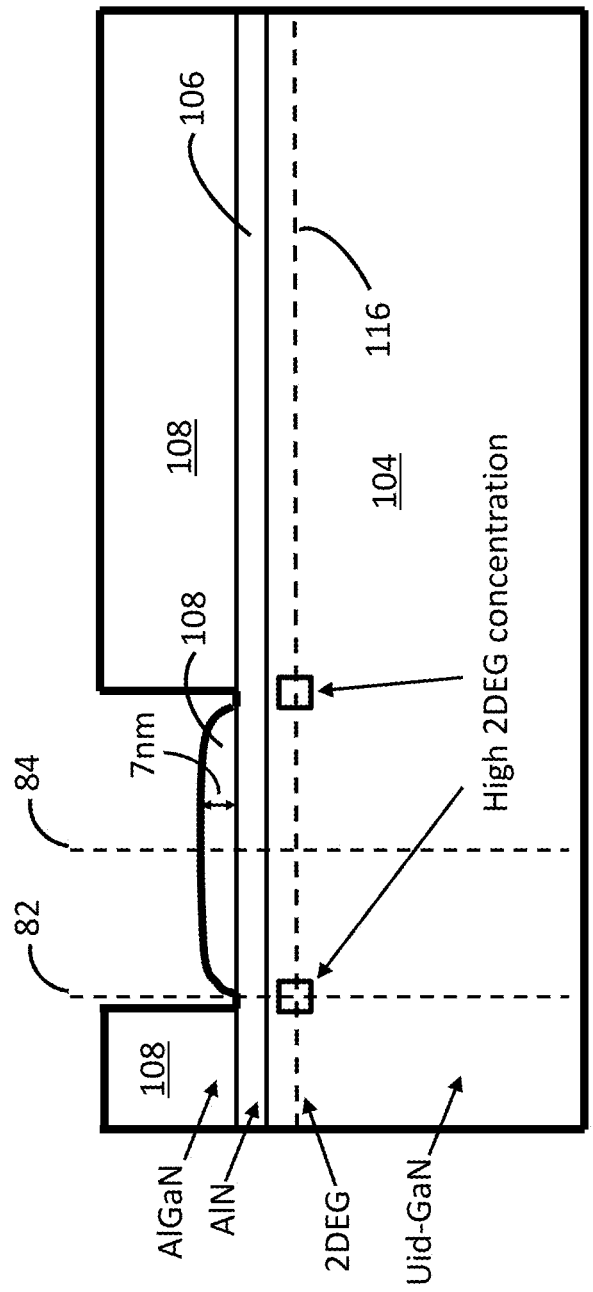
FIG. 8 is a cross-sectional view of a semiconductor material structure including a recess.
Figure 9A:
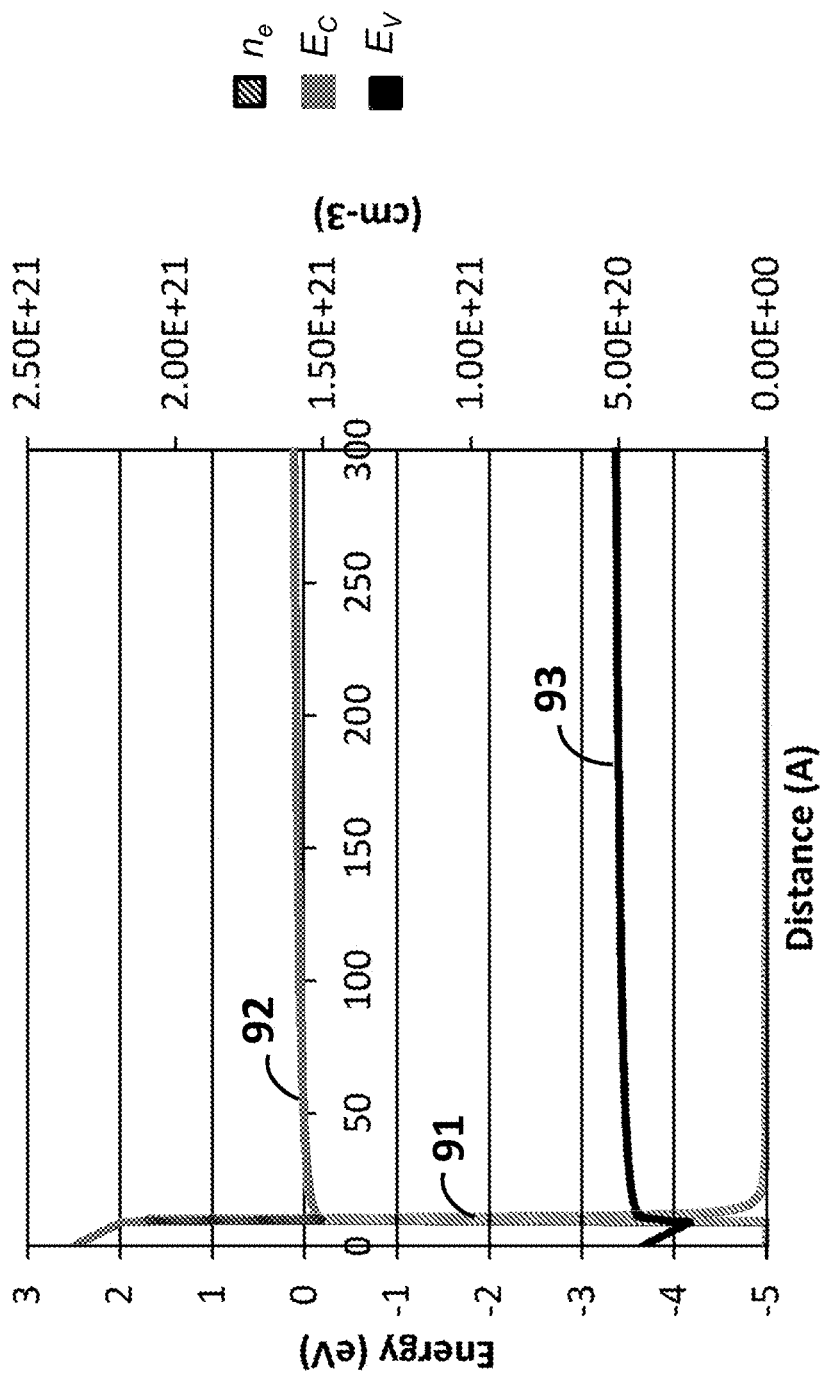
FIGS. 9A-9B are band diagrams along the vertical dashed lines in FIG. 8.
Figure 9B:
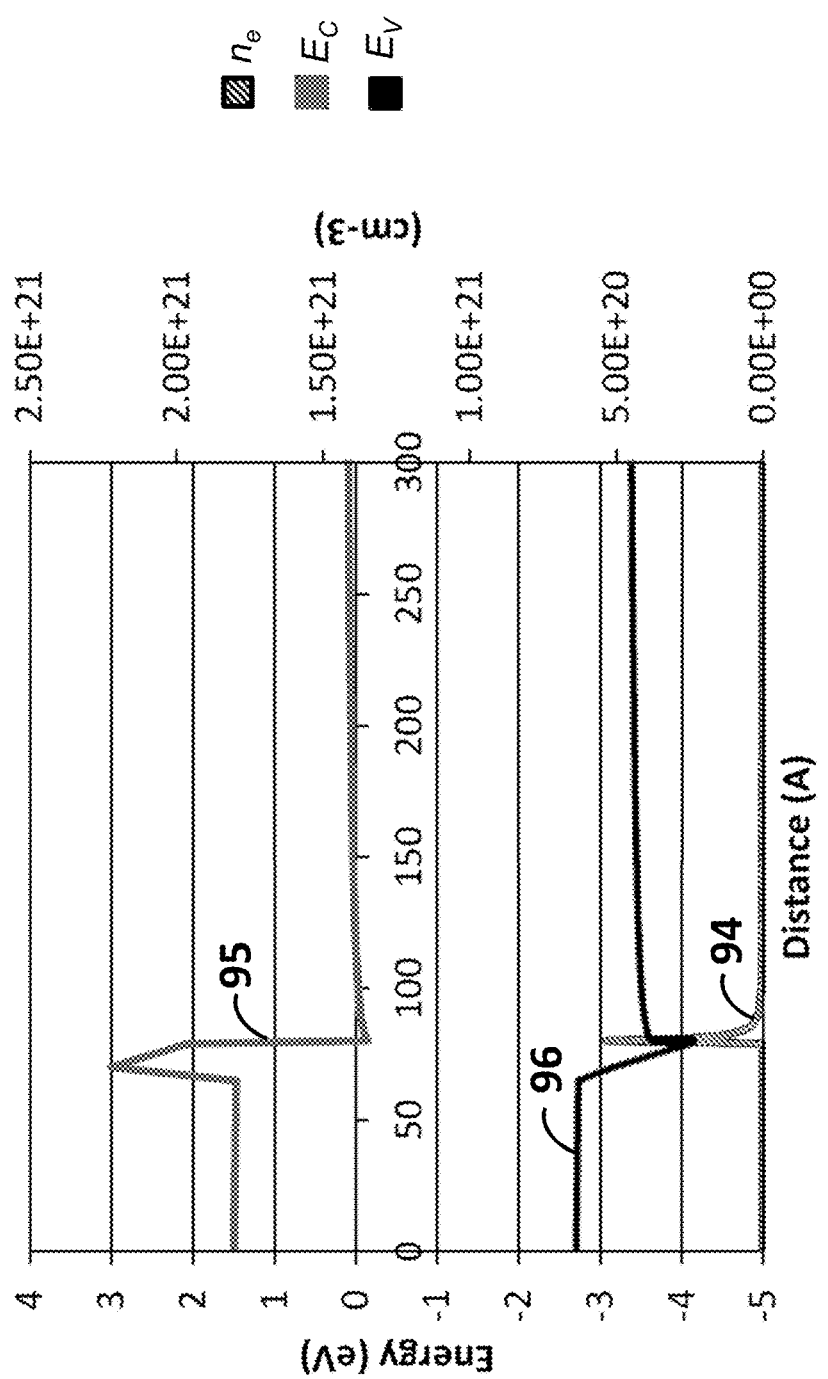

FIG. 8 shows a III-N semiconductor structure used in simulations to calculate band structures and electron carrier concentrations in regions below the source and drain electrodes of device 100. FIG. 9A is a band diagram of the semiconductor structure along line 82 (i.e., in layers 106 and 104), and FIG. 9B is a band diagram of the semiconductor structure along line 84 (i.e., in the remaining portion of layer 108 and in layers 106 and 104). In FIG. 9A, line 92 is the conduction band energy Ec (measured in eV, corresponding to the axis on the left), line 93 is the valence band energy Ev (measured in eV, corresponding to the axis on the left), and line 91 is the electron carrier concentration $n_e$ (measured in $cm^{-3}$, corresponding to the axis on the right). In FIG. 9B, line 95 is the conduction band energy Ec (measured in eV, corresponding to the axis on the left), line 96 is the valence band energy Ev (measured in eV, corresponding to the axis on the left), and line 94 is the electron carrier concentration $n_e$ (measured in $cm^{-3}$, corresponding to the axis on the right).

The spike in electron carrier concentration 91 in FIG. 9A corresponds to the position of the 2DEG channel 116 beneath the ends of the contact which extend downwards and contact the AlN spacer layer (i.e., ends 202a-c and 206a-c in FIG. 2), and the spike in electron carrier concentration 94 in FIG. 9A corresponds to the position of the 2DEG channel 116 beneath the center portion of the contact (i.e., portions 204a-c in FIG. 2). As seen in FIG. 8, there is no AlGaN barrier layer material directly above the AlN spacer layer below the downward-extending ends of the contact (along line 82), while in the center portion of the contact (along line 84) there is approximately 7 nm of AlGaN barrier layer material remaining over the AlN spacer layer. The simulations indicate that the 2DEG carrier concentration is substantially higher in the regions beneath the ends of the contact (i.e., the regions labeled 'High 2DEG concentration' in FIG. 8) than in the region beneath the center portion of the contact (the 2DEG carrier concentration in the regions beneath the ends of the contact was substantially higher than in any other portions of the 2DEG). This enhanced 2DEG carrier concentration beneath the downward extending ends of the contact is believed to be a reason why the recessed ohmic contacts described herein have a lower contact resistance than other types of ohmic contacts.

A number of implementations have been described. Nevertheless, it will be understood that various modifications may be made without departing from the spirit and scope of the techniques and devices described herein. For example, the processes described herein for forming alloyed ohmic contacts with reduced metal spitting can be used in the fabrication of other devices that require alloyed or annealed ohmic contacts, for example diodes, lasers, and LEDs. Accordingly, other implementations are within the scope of the following claims.

What is claimed is:
1. A device comprising:
a III-N layer having an upper side and a lower side, the lower side being opposite the upper side; and
a conductive contact on the upper side of the III-N layer, the conductive contact extending into the III-N layer, the conductive contact comprising:
 a first side surface and a second side surface opposite the first side surface;
 a top side facing away from the lower side of the III-N layer and extending from the first side surface to the second side surface; and
 a bottom side, which is non-planar, facing towards the lower side of the III-N layer, the bottom side comprising:
  a first end and a second end opposite the first end;
  a first side rising monotonically from the first end to an intermediate point; and
  a second side falling monotonically from the intermediate point to the second end; wherein
a separation between the intermediate point and the lower side of the III-N layer is less than a separation between the upper and lower sides of the III-N layer;
the first side surface falls monotonically from the top side to the first end of the bottom side; and
the second side surface falls monotonically from the top side to the second end of the bottom side.

2. The device of claim 1, the III-N layer comprising a III-N channel layer and a III-N barrier layer, wherein a compositional difference between the III-N channel layer and the III-N barrier layer causes a 2DEG channel to be induced in the III-N channel layer adjacent to the III-N barrier layer.

3. The device of claim 1, wherein the first side curves from the first end to the intermediate point and the second side curves from the second end to the intermediate point, forming a substantially rounded trench shape in the bottom side of the conductive contact.

4. The device of claim 1, the III-N layer comprising:
a GaN layer;
a III-N spacer layer on the GaN layer; and
a III-N barrier layer on the III-N spacer layer.

5. The device of claim 4, wherein the III-N spacer layer has a larger bandgap than the III-N barrier layer.

6. The device of claim 5, wherein:
the first end or the second end or both extend to the III-N spacer layer; and
the intermediate point is located in the III-N barrier layer.

7. The device of claim 6, wherein at least one of the first end and the second end extends through the III-N spacer layer to contact the GaN layer.

8. The device of claim 4, wherein the III-N spacer layer comprises AlN and the III-N barrier layer comprises AlGaN.

9. The device of claim 1, wherein the conductive contact is a source contact, the device further comprising a drain contact and a gate contact, forming a transistor.

10. The device of claim 9, wherein the drain contact comprises:
a drain top side facing away from the lower side of the III-N layer; and
a drain bottom side facing towards the lower side of the III-N layer, the bottom side comprising:
a drain first end and a drain second end opposite the drain first end;
a drain first side rising from the drain first end to a drain intermediate point closer to the top side than the drain first end; and
a drain second side falling from the drain intermediate point to a drain second end further from the top side than the drain intermediate point.

11. The device of claim 10, wherein the transistor is a lateral transistor having the drain, source, and gate on a same side.

12. The device of claim 10, wherein the drain first side rises monotonically from the drain first end to the drain intermediate point and the drain second bottom side falls monotonically from the drain intermediate point to the drain second end.

13. The device of claim 1, wherein the conductive contact has a normalized contact resistance of 0.3 Ohm-mm or less.

14. The device of claim 1, wherein the first end or the second end has a width less than 300 nanometers.

15. The device of claim 1, wherein the III-N layer is on a substrate.

16. A method for fabricating a device, the method comprising:
forming a III-N layer having an upper side and a lower side, the lower side being opposite the upper side;
forming a recess in a surface on the upper side of the III-N layer, including etching the surface of the III-N layer using a resist pattern;
forming a conductive contact over the recess in the surface of the III-N layer, the conductive contact comprising:
a first side surface and a second side surface opposite the first side surface;
a top side facing away from the lower side of the III-N layer and extending from the first side surface to the second side surface; and
a bottom side, which is non-planar, facing towards the lower side of the III-N layer, the bottom side comprising:
a first end and a second end opposite the first end;
a first side rising monotonically from the first end to an intermediate point; and
a second side falling monotonically from the intermediate point to the second end; wherein
a separation between the intermediate point and the lower side of the III-N layer is less than a separation between the upper and lower sides of the III-N layer;
the first side surface falls monotonically from the top side to the first end of the bottom side; and
the second side surface falls monotonically from the top side to the second end of the bottom side.

17. The method of claim 16, comprising heating the device to a temperature between 300° C. and 600° C.

18. The method of claim 17, wherein heating the device comprises heating the device for one to three minutes.

19. The method of claim 16, wherein etching the surface of the III-N layer comprises performing a dry etch using a chlorine based gas.

20. The method of claim 19, wherein etching the surface of the III-N layer comprises performing a plasma etch in $Cl_2$ plasma at an RF bias of 25 W or less.

21. The method of claim 16, wherein forming the III-N layer comprises forming:
a GaN layer;
an AlN spacer layer on the GaN layer; and
an AlGaN layer on the AlN spacer layer.

22. The method of claim 21, wherein forming the recess comprises forming the recess through the AlGaN layer up to the AlN spacer layer.

23. The method of claim 21, wherein forming the recess comprises forming the recess through the AlGaN layer and into the AlN spacer layer.

24. The method of claim 21, wherein forming the recess comprises forming the recess through the AlGaN layer and the AlN spacer layer and into the GaN layer.

* * * * *